(12) United States Patent
Elkhomri

(10) Patent No.: US 12,422,793 B2
(45) Date of Patent: Sep. 23, 2025

(54) METHOD AND SYSTEM FOR IDENTIFYING REAL PLANT BROADBAND DYNAMICS PERFORMANCE IN GREEN ENERGY GENERATION UTILIZING ARTIFICIAL INTELLIGENCE TECHNOLOGY

(71) Applicant: Banpu Innovation & Ventures LLC, Wilmington, DE (US)

(72) Inventor: Othman Elkhomri, Wilmington, DE (US)

(73) Assignee: Banpu Innovation & Ventures LLC, Wilmington, DE (US)

( * ) Notice: Subject to any disclaimer, the term of this patent is extended or adjusted under 35 U.S.C. 154(b) by 988 days.

(21) Appl. No.: 17/454,366

(22) Filed: Nov. 10, 2021

(65) Prior Publication Data
US 2023/0142580 A1    May 11, 2023

(51) Int. Cl.
G05B 13/04    (2006.01)
E21B 44/00    (2006.01)
(Continued)

(52) U.S. Cl.
CPC ............ *G05B 13/042* (2013.01); *E21B 44/00* (2013.01); *E21B 47/07* (2020.05); *E21B 47/10* (2013.01);
(Continued)

(58) Field of Classification Search
None
See application file for complete search history.

(56) References Cited

U.S. PATENT DOCUMENTS

2002/0148646 A1* 10/2002 Schultz .................. E21B 12/02
175/39
2021/0124087 A1* 4/2021 Liu ......................... G06F 30/28
(Continued)

OTHER PUBLICATIONS

Lakshmanan, Charan, Srikanth Muralidhara, Nachiket Karajagi, and Somdatta Chakraborty. "Artificial Intelligence Based Optimization of Gathering System." In Abu Dhabi International Petroleum Exhibition and Conference, p. D021S031R002. SPE, Nov. 2020. pp. 2 &4. (Year: 2020) (Year: 2020).*

*Primary Examiner* — Rehana Perveen
*Assistant Examiner* — Eric Post
(74) *Attorney, Agent, or Firm* — Osha Bergman Watanabe & Burton LLP

(57) ABSTRACT

A method of managing a well system includes: obtaining, based on a predetermined monitoring criterion, well dynamics behavior data of the well system; obtaining modeled well dynamics behavior data for the well system using a physics-based model; decomposing each of the well dynamics behavior data and the modeled well dynamics behavior data into a plurality of frequency band components based on a plurality of predetermined frequency partitions; training a physics constrained machine learning model using one or more machine learning algorithms based on the plurality of frequency band components of the decomposed well dynamics behavior data and the decomposed modeled well dynamics behavior data as input data; obtaining new well dynamics behavior data of the well system; outputting predicted well dynamics behavior data based on the new well dynamics behavior data using the physics-based model and the trained physics constrained machine learning model.

15 Claims, 12 Drawing Sheets

(51) Int. Cl.
*E21B 47/07* (2012.01)
*E21B 47/10* (2012.01)
*G05B 13/02* (2006.01)
*G06F 30/27* (2020.01)

(52) U.S. Cl.
CPC ......... *G05B 13/0265* (2013.01); *G06F 30/27* (2020.01); *E21B 2200/20* (2020.05); *E21B 2200/22* (2020.05)

(56) References Cited

U.S. PATENT DOCUMENTS

| | | | | |
|---|---|---|---|---|
| 2021/0383041 | A1* | 12/2021 | Harvey | G06N 3/048 |
| 2021/0404314 | A1* | 12/2021 | Filippov | E21B 44/00 |
| 2023/0117396 | A1* | 4/2023 | Chanpura | G01H 1/003 |
| | | | | 175/50 |
| 2023/0266500 | A1* | 8/2023 | Soroush | E21B 41/00 |
| | | | | 175/50 |

\* cited by examiner

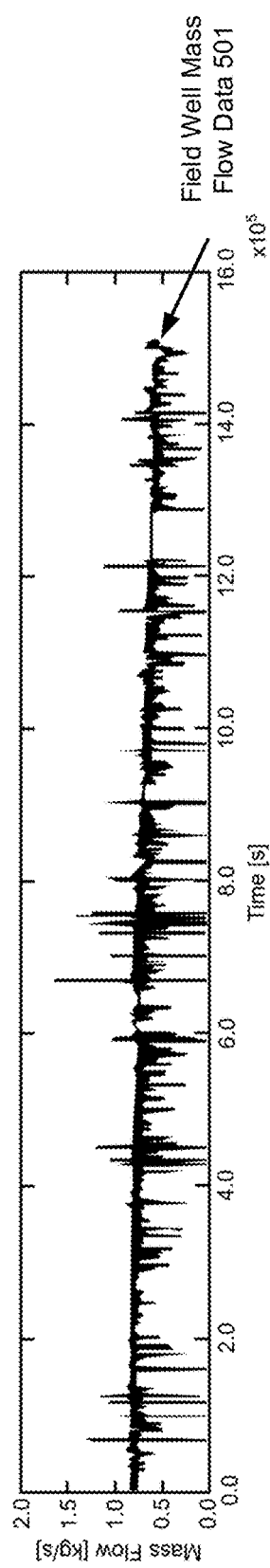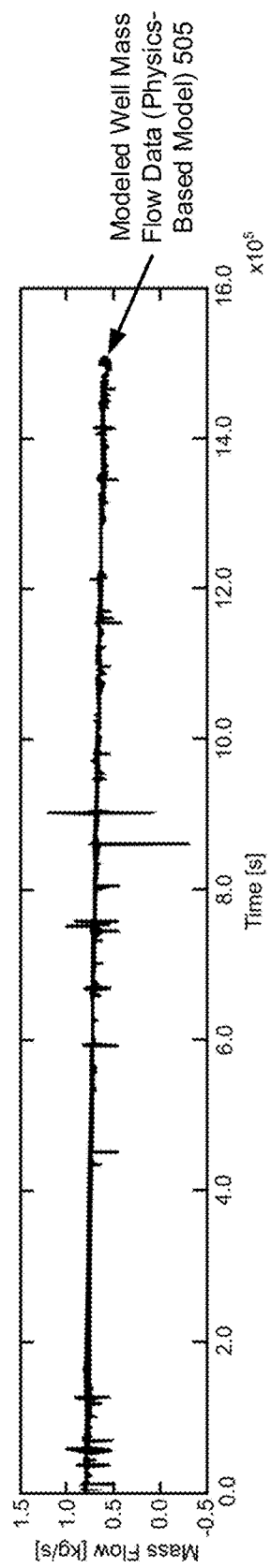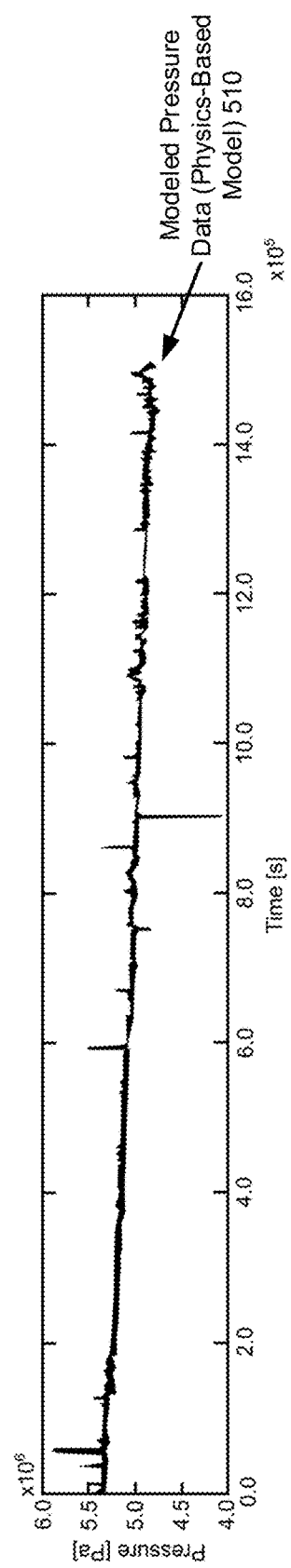

METHOD AND SYSTEM FOR IDENTIFYING REAL PLANT BROADBAND DYNAMICS PERFORMANCE IN GREEN ENERGY GENERATION UTILIZING ARTIFICIAL INTELLIGENCE TECHNOLOGY

BACKGROUND

In the field of green energy generation, techniques for efficiently gathering natural resources are of great importance for maximizing production while minimizing environmental impact and risks. A physics-based model is developed to replicate the dynamics performance of a field well system with a good degree of accuracy. However, one of the main limits of the physics-based model is the capability to replicate low-frequency aspects of the broadband and high resolution well dynamics behavior of the well subsystem that are difficult to model by a lumped-parameter approach. To improve the effectiveness and frequency bandwidth of predicting broadband dynamics performance according to the lumped-parameter model, a machine learning (ML) model is developed in a digital twin for the well system of interest based on information of field well measurements under normal operating conditions.

SUMMARY

In general, embodiments of the invention relate to a method of managing a well system including: obtaining, by a digital twin manager and based on a predetermined monitoring criterion, well dynamics behavior data of the well system; obtaining, by the digital twin manager, modeled well dynamics behavior data for the well system using a physics-based model; decomposing, by the digital twin manager, each of the well dynamics behavior data and the modeled well dynamics behavior data into a plurality of frequency band components based on a plurality of predetermined frequency partitions; training, by the digital twin manager, a physics constrained machine learning model using one or more machine learning algorithms based on the plurality of frequency band components of the decomposed well dynamics behavior data and the decomposed modeled well dynamics behavior data as input data; obtaining, by the digital twin manager, new well dynamics behavior data of the well system; outputting, by the digital twin manager, predicted well dynamics behavior data based on the new well dynamics behavior data using the physics-based model and the trained physics constrained machine learning model; and transmitting, by the digital twin manager, a command to the well system that adjusts a well operation based on the predicted well dynamics behavior data.

In addition, embodiments of the invention relate to a well system including: a well site; a physics-based modeling server that outputs modeled dynamics behavior data for the well site based on a physics-based model; and a digital twin manager, coupled to the physics-based modeling server and the well site, that includes a processor. The digital twin manager: obtains, based on a predetermined monitoring criterion, well dynamics behavior data of the well site; obtains modeled well dynamics behavior data for the well system using a physics-based model; decomposes each of the well dynamics behavior data and the modeled well dynamics behavior data into a plurality of frequency band components based on a plurality of predetermined frequency partitions; trains a physics constrained machine learning model using one or more machine learning algorithms based on the plurality of frequency band components of the decomposed well dynamics behavior data and the decomposed modeled well dynamics behavior data as input data; obtains new well dynamics behavior data of the well site; outputs predicted well dynamics behavior data based on the new well dynamics behavior data using the physics-based model and the trained physics constrained machine learning model; and transmits a command to the well system that adjusts a well operation based on the predicted well dynamics behavior data.

Furthermore, embodiments of the invention relate to a non-transitory computer readable medium storing instructions executable by a computer processor. The instructions comprising functionality for: obtaining well dynamics behavior data of a well system based on a predetermined monitoring criterion; obtaining modeled well dynamics behavior data for the well system using a physics-based model; decomposing each of the well dynamics behavior data and the modeled well dynamics behavior data into a plurality of frequency band components based on a plurality of predetermined frequency partitions; training a physics constrained machine learning model using one or more machine learning algorithms based on the plurality of frequency band components of the decomposed well dynamics behavior data and the decomposed modeled well dynamics behavior data as input data; obtaining new well dynamics behavior data of the well system; outputting predicted well dynamics behavior data for the well system based on the new well dynamics behavior data using the physics-based model and the trained physics constrained machine learning model; and transmitting a command to the well system that adjusts a well operation based on the predicted well dynamics behavior data.

Other aspects and advantages of the claimed subject matter will be apparent from the following description and the appended claims.

BRIEF DESCRIPTION OF DRAWINGS

Specific embodiments of the disclosed technology will now be described in detail with reference to the accompanying figures. Like elements in the various figures are denoted by like reference numerals for consistency.

FIGS. 5A, 5B, and 5C show examples in accordance with one or more embodiments.

DETAILED DESCRIPTION

Figure 1:
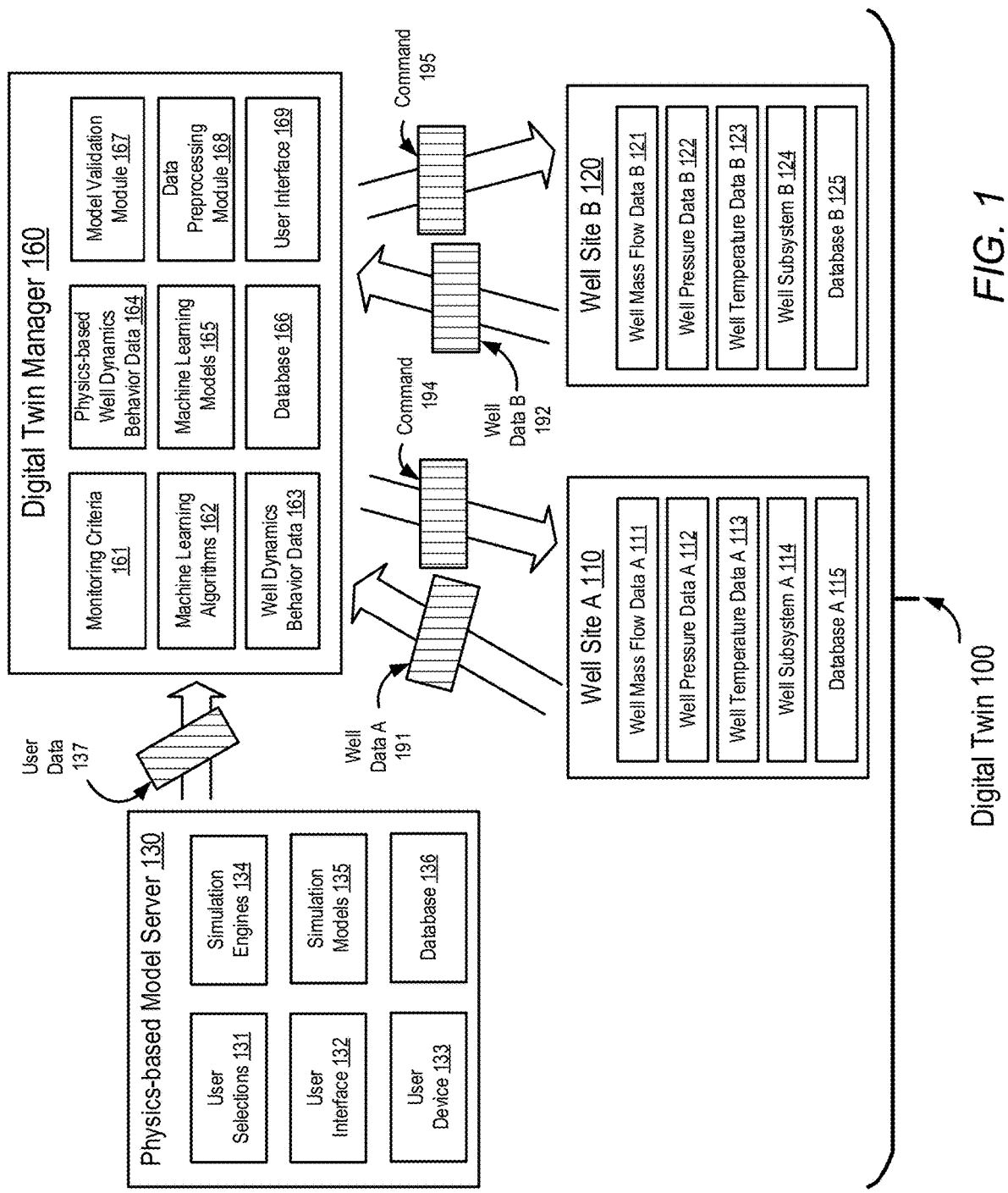
FIG. 1 shows a system in accordance with one or more embodiments.

In the following detailed description of embodiments of the disclosure, numerous specific details are set forth in order to provide a more thorough understanding of the disclosure. However, it will be apparent to one of ordinary skill in the art that the disclosure may be practiced without these specific details. In other instances, well-known features have not been described in detail to avoid unnecessarily complicating the description.

In general, embodiments of the disclosure include systems and methods for a digital twin of a well system of interest to predict broadband well dynamics performance gradually from low frequency to high frequency by applying an artificial neural network and a Levenberg-Marquardt algorithm in a physics constrained machine learning (ML) workflow. By improving prediction of broadband well mass flow of a well system, a larger set of detailed and high-resolution features and more accurate control information (e.g., maintenance periods may be predicted and scheduled based on identified declines or transient features in well mass flow performance; production equipment may be regulated to mitigate system faults/failures or avoid costly emergency shut-down conditions) may be extracted from the digital twin of the well system. As a result, production facilities and well systems for green energy generation may be operated with higher efficacy.

A digital twin may be an integrated multi-physics, multi-scale, probabilistic simulation of an as-built system, enabled by digital thread, that uses the best available models, sensor information, and input data to emulate activities and/or performance over the life of a physical system (e.g., a well system). The well system may include one or more interconnected subsystems that include a compressor subsystem and a sales header subsystem. The digital twin of the well system of interest may be applied to generate one or more models to represent a well system and automatically emulate broadband well dynamics behavior (e.g., mass flow, pressure, and/or temperature data) gradually from low frequency to high frequency in the field of energy generation for monitoring and predictive maintenance purposes based on a physics-based model and a field well dynamics behavior of the well system of interest. For example, the digital twin for the well system of interest may apply the physics constrained machine learning workflow to reduce prediction error between the predicted broadband well dynamics behavior and the obtained well dynamics behavior from a field well system of interest. As another example, the digital twin for the well system of interest may assess the predicted broadband well dynamics behavior to monitor normal operations of the well system and/or predict system faults, system failures, and system shut-downs.

Furthermore, the digital twin of the well system of interest may use a Levenberg-Marquardt algorithm and an artificial neural network to solve a least-squares curve fitting problem which has a misfit function which includes a well dynamics behavior prediction error (e.g., integral square error (ISE), mean error (ME), normalized ISE, and normalized ME) based on the difference between predicted broadband well dynamics behavior obtained using a physics constrained machine learning model and acquired well dynamics behavior from the well system of interest. One or more embodiments apply a Levenberg-Marquardt algorithm within a digital twin of the well system of interest to improve the convergence time of a ML algorithm and the accuracy of predicted broadband dynamics of the well system of interest. In particular, the Levenberg-Marquardt algorithm interpolates between a Gauss-Newton algorithm and a steepest descend algorithm. The Levenberg-Marquardt algorithm applies a steepest descend algorithm when the misfit function is complex for a model at an iteration and approximately performs a Gauss-Newton algorithm when the misfit function for a model at an iteration is close to a quadratic approximation.

Furthermore, one or more embodiments apply an artificial neural network within a digital twin of the well system of interest. For example, the artificial neural network may determine one or more weights of an artificial neural network based on a probabilistic nature, allowing the network to automatically and optimally penalize excessively complex models. In particular, the artificial neural network converts a non-linear regression into a well-posed statistical problem based on ridge regression which has considerably smaller than the number of weights in a fully connected back-propagation neural network. The artificial neural network may improve effectiveness, generalization, and prediction quality of the ML model and reduce the potential for overfitting and overtraining of the ML model. Thus, the physics constrained machine learning workflow of the digital twin for a well system of interest provides a fast and stable numerical solution to non-linear least-squares curve fitting problem to predict well dynamics behavior gradually from low frequency to high frequency based on the well dynamics behavior obtained using a physics-based model and the acquired well dynamics behavior from the well system of interest. The final predicted broadband well dynamics behavior may be determined by merging the predicted well dynamics behavior from one or more frequency bands with a straight or weighted summation in time or frequency domain.

FIG. 1 shows a system in accordance with one or more embodiments. As shown in FIG. 1, a digital twin (100) for a well system of interest may include a digital twin manager (160), a well system comprising one or more well sites (e.g., well site A (110), well site B (120)), and/or various network elements (not shown). A well site (e.g., well site A (110), well site B (120)) may include a well subsystem (e.g., a compressor subsystem or a sales header subsystem). A well subsystem is described in further detail below with respect to FIG. 4 and the accompanying description. In some embodiments, the digital twin manager (160) obtains one or more types of well data (e.g., well data A (191), well data B (192)), such as well mass flow data (e.g., well mass flow data A (111), well mass flow data B (121)), well pressure data (e.g., well pressure data A (112), well pressure data B (122)), well temperature data (e.g., well temperature data A (113), well temperature data B (123)), one or more well subsystem data (e.g., data or parameters characterizing well subsystem A (114), well subsystem B (124)), and other well activities data stored in a database (e.g., database A (115), database B (125)). Likewise, the digital twin manager (160) may also obtain user data (137) (e.g., modeled well data from one or more physics-based model servers (130)). For example, well mass flow data A (111) may include measurements of mass flow (e.g., in kilogram/second (kg/s) or any other appropriate unit) for the well subsystem A (114). Well pressure data A (112) may include measurements of pressure (e.g., in Pascal (Pa) or any other appropriate unit) for one or more positions in the well subsystem A (114). Well temperature data A (113) may include measurements of temperature (e.g., in Fahrenheit degree (F.)) for one or more positions in the well subsystem A (114). Modeled well mass flow, well pressure, and well temperature data included in the user data (137) may include measurements of mass flow in kg/s, pressure in Pa, and temperature in F for one or more well subsystems determined by a physics-based model server (130) for each well subsystem. As another example, each well subsystem may include information associated with a flow element and a flow meter based on the mass and/or volumetric flow rate, turn-down ratio (e.g., range of flow to be measured), pressure, temperature, and extent of flow surging. Likewise, each well subsystem may include various safety alerts, conditions at one or more wells (e.g., corresponding to system faults, system failures, system shutdowns, safety conditions, weather conditions, well conditions, etc.).

In some embodiments, a physics-based model server (130) may be a remote server that includes hardware and/or software with functionality for determining well dynamics behavior for a well system of interest. For example, the physics-based model server (130) may use one or more simulation engines (134) to apply one or more simulation models (135) to model well dynamics behavior data (e.g., mass flow, pressure, and/or temperature data) of a well subsystem and store the modeled well dynamics behavior data in a database (136) based on user selections (131) obtained from a user device (133) via a user interface (132) for a particular time period. For example, the user device (133) may include hardware and/or software to receive user selections (131) in real-time by interacting with a user via the user interface (132). Likewise, a remote server may be a server that communicates to various wells over a network or through a cloud computing environment. The well dynamics behavior data (e.g., well mass flow data A (111), well pressure data A (112), well temperature data A (113), well mass flow data B (121), well pressure data B (122), well temperature data B (123)) from the well subsystems may be automatically transmitted to the physics-based model server and stored in the database (136).

Furthermore, the digital twin manager (160) may include hardware and/or software with functionality for obtaining a monitoring criterion (161) regarding digital twin activities, well data (e.g., well dynamics behavior data (163)), and physics-based well dynamics behavior data (164) (e.g., the modeled well dynamics behavior data from the physics-based model server (130)) from data inputs (e.g., user data (137), well data A (191), well data B (192)). For example, the digital twin manager (160) acquires the monitoring criterion (161) by interacting with a user via a user interface (169). In particular, the monitoring criterion may include a threshold limiting the misfit function based on well dynamics behavior determined by a machine learning model (e.g., ML models (165)) and field well dynamics behavior obtained from one or more well subsystems. As another example, the digital twin manager (160) may allow the user to interact with a user device (133) to modify the monitor criterion (161) to verify the ML model (165) is designed as desired and that the performance of the digital twin (100) is set up for predicting well dynamics behavior to help to monitor the performance of one or more field well systems (e.g., well site A (110), well site B (120)). For example, when the misfit function is larger than the monitoring criterion (161) (e.g., a value of "50"), the ML model (165) is not desired and a new model may be developed. Thus, the user can modify the monitoring criterion (161) via the user interface (169) to adjust the ML model (165) and/or the physics-based model (e.g., simulation models (135)) to improve the performance of the digital twin (100) of the well system.

Keeping with FIG. 1, in some embodiments, the digital twin manager (160) may include hardware and/or software with functionality for determining a predicted well dynamics behavior using a ML algorithm (162) based on the modeled well dynamics behavior data (e.g., physics-based well dynamics behavior data (164)) obtained from the physics-based model server (130) and obtained well dynamics behavior data (163) from the well system (e.g., well mass flow data A (111), well pressure data A (112), well temperature data A (113), well mass flow data B (121), well pressure data B (122), well temperature data B (123)). In some embodiments, the digital twin manager (160) transmits a command (e.g., command (194), command (195)) to a well site (e.g., well site A (110), well site B (120), respectively) to perform one or more well operations to control well activities (e.g., to control well subsystem A (114), well subsystem B (124) and affect well mass flow data A (111), well pressure data A (112), well pressure data B (122), well mass flow data B (121), well temperature data A (113), well temperature data B (123)), and other well activities data stored in a database (e.g., database A (115), database B (125)) for the well system. For example, a digital twin manager (160) may implement a ML model (165) to predict well mass flow stored in a database (166) based on the obtained well dynamics behavior data from the physics-based model server (130) (e.g., physics-based well dynamics behavior data (164)) and well dynamics behavior data (163) from one or more wells to tune a particular monitoring criterion (161) for the well system. Thus, different inputs (e.g., types of data or different data sources) may provide the initial setup of a particular monitoring criterion.

Furthermore, the data inputs may be customized by a data preprocessing module (168) according to different physics-based models to better arrange a monitoring criterion. For example, the data preprocessing module (168) may normalize the data inputs by subtracting mean value and scaling the data inputs by standard deviation. As another example, the data preprocessing module (168) may apply a filter to remove high-frequency components (e.g., sensor's noise) that cannot be emulated by ML algorithms (162). In particular, the data preprocessing module (168) may apply a filter to decompose the data inputs into one or more narrow frequency bands. A filter may be a Butterworth filter, a Chebyshev filter, a Gaussian filter, a Bessel filter, an Elliptic filter, or a raised-cosine filter. Likewise, the data preprocessing module (168) may merge one or more narrow frequency band data outputs to single broadband data outputs by a straight or weighted summation in time or frequency domain. Since the digital twin manager (160) is self-maintained on data storage and usage for monitoring and predictive maintenance purposes, the digital twin manager (160) may require minimal supervision or human interaction.

In some embodiments, the digital twin manager (160) advises a user about a regular structure of setting a well monitoring criterion when the learning process detects a feature that a human might miss due to the complexity and amount of data and variables. For example, an advisement may be a message prompt in a graphical user interface (e.g., user interface (169)) managed by the digital twin manager (160).

In some embodiments, for example, the digital twin manager (160) applies one or more ML algorithms (162) (e.g., an artificial neural network) to train a ML model (165) to determine well dynamics behavior at a well (e.g., well site A (110), well site B (120)). Likewise, the digital twin manager (160) includes a model validation module (167) to validate the ML model (165). In some embodiments, a digital twin manager (160) may generate augmented or synthetic data to produce a large amount of interpreted data for training a particular model. Likewise, a ML model (165) may be trained using one or more ML algorithms (162).

In some embodiments, a ML model (165) may be trained by using a backpropagation algorithm (e.g., an artificial neural network) to train a neural network. A neural network may include one or more hidden layers, where a hidden layer includes one or more neurons. A neuron may be a modelling node or object that is loosely patterned on a neuron of the human brain. In particular, a neuron may combine data inputs with a set of coefficients (i.e., a set of network weights and biases for adjusting the data inputs). These network weights may amplify or reduce the value of a particular data input, thereby assigning an amount of significance to various data inputs for a task being modeled. These network biases may add a constant (e.g., a given bias) to a particular data input, thereby shifting the activation function for a task being modeled. Through machine learning, a neural network may determine which data inputs should receive greater priority in determining one or more specified outputs of the neural network. Likewise, these weighted data inputs may be summed such that this sum is communicated through a neuron's activation function to other hidden layers within the neural network. As such, the activation function may determine whether and to what extent an output of a neuron progresses to other neurons where the output may be weighted again for use as an input to the next hidden layer.

As another example, in some embodiments, a ML model (165) may be trained by an artificial neural network which applies a Levenberg-Marquardt algorithm. The training data may include historical events obtained from a physics-based model server (130) and well data (e.g., well data A (191), well data B (192)) from a well system of interest. A digital twin manager (160) may continue to train the ML model (165) by adjusting the physics-based model server (130) to more accurately model the physics-based well dynamics behavior data (164). Thus, the ML model (165) predicts the well dynamics behavior of the well system of interest because the learning process of the algorithm is setup for monitoring and predictive maintenance purposes as desired.

Furthermore, the digital twin manager (160) may use an artificial neural network which converts a non-linear regression into a well-posed statistical problem based on ridge regression. The artificial neural network has considerably smaller than the number of weights in a fully connected back-propagation neural network. The artificial neural network updates weights and biases according to Levenberg-Marquardt optimization to minimize a combination of squared errors and weights and then determine combination for a generalized model. Thus, the artificial neural network may reduce or eliminate the need for lengthy cross-validation.

Furthermore, the digital twin manager (160) may use a Levenberg-Marquardt algorithm to solve non-linear least-squares curve fitting problem to minimize the misfit function based on the difference between the modeled well dynamics behavior obtained using a physics-based model and the acquired well dynamics behavior from the well system of interest. The Levenberg-Marquardt algorithm is a combination of the steepest descent method and the Gauss-Newton method. In the steepest descent method, the misfit function is minimized by seeking a solution in the steepest descent direction. In the Gauss-Newton method, the misfit function is minimized by seeking a solution assuming the misfit function is locally quadratic. For example, the Levenberg-Marquardt algorithm is more like a steepest descent method when the model is far from the optimal model and the misfit function is complex with many local minimums. On the other hand, the Levenberg-Marquardt algorithm is more like a Gauss-Newton method to speed up convergence when the model is close to the optimal model and the misfit function is close a quadratic approximation.

Figure 2:
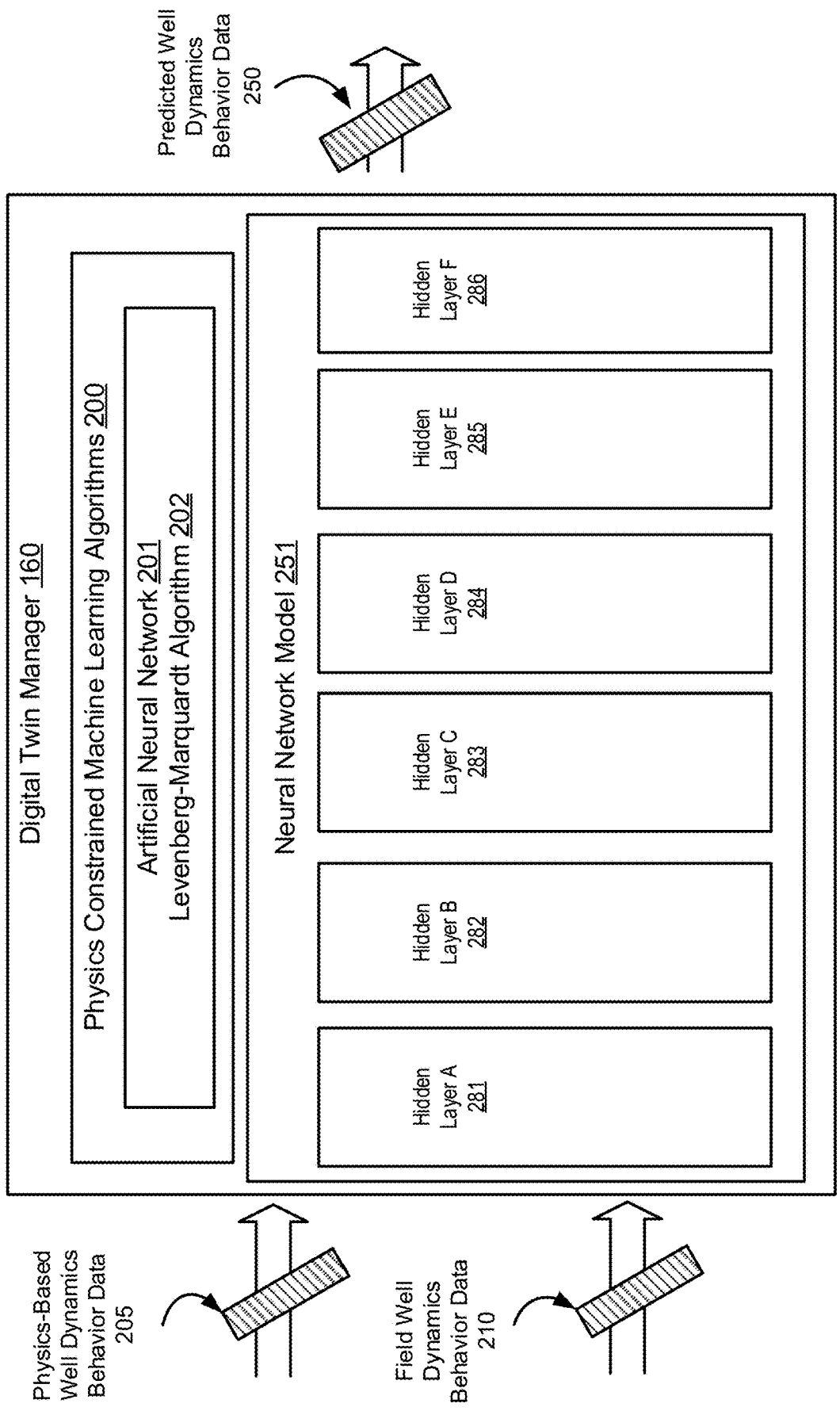
FIG. 2 shows an example in accordance with one or more embodiments.

FIG. 2 shows an example of generating a model to determine well dynamics behavior data (250) based on the physics-based well dynamics behavior data (i.e., a modeled well dynamics behavior data for the well system) determined by a physics-based model (205) and the well mass flow data obtained from a well system of interest (210) in accordance with one or more embodiments. The following example is for explanatory purposes only and not intended to limit the scope of the disclosed technology.

In FIG. 2, a neural network model (251) is trained using one or more physics constrained machine learning algorithms (200) for predicting well dynamics behavior data (250). The physics constrained machine learning algorithms (200) include an artificial neural network (201) and a Levenberg-Marquardt algorithm (202). The neural network model (251) obtains physics-based well dynamics behavior data (205) based on a physics-based model and field well dynamics behavior data (210) acquired from a well system to determine the predicted outputs represented by the output layer consisting of predicted well dynamics behavior data (250). The input parameters (e.g., physics-based well dynamics behavior data (205), field well dynamics behavior data (210)) are synchronized and preprocessed with a quality control operation (e.g., by the data preprocessing module (168) of the digital twin manager (160)). The predicted well dynamics behavior data (250) may have higher time resolution than the field well dynamics behavior data (210) and may capture broadband dynamics behavior of the well system or an individual well subsystem.

Furthermore, the neural network model (251) may include six hidden layers (i.e., hidden layer A (281), hidden layer B (282), hidden layer C (283), hidden layer D (284), hidden layer E (285), hidden layer F (286)), which may be a convolutional layer, a pooling layer, a rectified linear unit (ReLU) layer, a softmax layer, a regressor layer, a dropout layer, and/or various other hidden layer types. In some embodiments, the number of hidden layers may be greater than or less than six. These hidden layers can be arranged in any order as long as they satisfy the input/output size criteria. Each layer comprises of a set number of image filters. The output of filters from each layer is stacked together in the third dimension. This filter response stack then serves as the input to the next layer(s). Furthermore, each hidden layer may be featured by 20 neurons or any appropriate number of neurons.

In some embodiments, the hidden layers are configured as follows. The hidden layer A (281) and the hidden layer B (282) may be down-sampling blocks to extract high-level features from the input data set. The hidden layer D (284) and the hidden layer E (285) may be up-sampling blocks to output the classified or predicted output data set. The hidden layer C (283) may perform residual stacking as bottleneck between down-sampling blocks (e.g., hidden layer A (281), hidden layer B (282)) and up-sampling blocks (e.g., hidden layer D (284), hidden layer E (285)). The hidden layer F (286) may include a softmax layer or a regressor layer to classify or predict a predetermined class or a value based on input attributes.

In a convolutional layer, the input data set is convolved with a set of learned filters that are designed to highlight specific characteristics of the input data set. A pooling layer produces a scaled down version of the output by considering small neighborhood regions and applying a desired operation filter (e.g. min, max, mean, etc.) across the neighborhood. A ReLU layer enhances a nonlinear property of the network by introducing a non-saturating activation function. One example of such a non-saturating function is to threshold out negative responses (i.e., set negative values to zero). A fully connected layer provides a high-level reasoning by connecting each node in the layer to all activation nodes in the previous layer. A softmax layer maps the inputs from the previous layer into a value between 0 and 1 or between −1 and 1. Therefore, a softmax layer allows for interpreting the outputs as probabilities and selection of classified facie with highest probability. In particular, a softmax layer may apply a symmetric sigmoid transfer function to each element of the raw outputs independently to interpret the outputs as probabilities in the range of values between −1 and 1. A dropout layer offers a regularization technique for reducing network over-fitting on the training data by dropping out individual nodes with a certain probability. A loss layer (e.g., utilized in training) defines a weight dependent cost function that needs to be optimized (i.e., bring the cost down toward zero) for improved accuracy.

In some embodiments, each hidden layer is a combination of a convolutional layer, a pooling layer, and a ReLU layer in a multilayer architecture. For example, each hidden layer (e.g., hidden layer A (281), hidden layer B (282), hidden layer C (283), hidden layer D (284), hidden layer E (285), hidden layer F (286)) has a convolutional layer, a pooling layer, and a ReLU layer.

Furthermore, the physics constrained machine learning algorithms (200) may include an activation function in a ReLU layer (e.g., hidden layer F (286)) to calculate the misfit function based on the difference between the predicted well dynamics behavior data (250) and a ground truth (e.g., field well dynamics behavior data (210) obtained from the well system). In some embodiments, a physics constrained machine learning algorithm (200) may use a simple data split technique to separate the input dynamics behavior data (e.g., physics-based well dynamics behavior data (205) and field well dynamics behavior data (210)) used for the training, validation, and testing of the physics constrained machine learning models. An example, the data split technique may consider 70% of the obtained well dynamics behavior data for model training (e.g., tuning of the model parameters), 15% of the obtained well dynamics behavior data for validation (e.g., performance validation for each different set of model parameters), and 15% of the obtained well dynamics behavior data for testing the final trained model. However, the data split technique may be appropriately adjusted (e.g., by the user) to prevent over-fitting that results in physics constrained machine learning models with limited generalization capabilities (e.g., models that underperform when predicting unseen sample data).

Furthermore, the physics constrained machine learning algorithms (200) may apply a nested k-fold inner/outer cross-validation to tune and validate the optimal parameters of the ML model. In one or more embodiments, the nested stratified inner/outer cross-validation may be a software and/or hardware system that includes functionality to mitigate the over-fitting problem of the ML model by applying a k-fold inner cross-validation and a k-fold outer cross-validation. The k-fold inner cross-validation and the k-fold outer cross-validation may have different values of the "k" parameter. In some example embodiments, the nested inner/outer cross-validation defines one or more physics constrained machine learning algorithms and their corresponding models in a grid and evaluates one or more performance metrics of interest (e.g., area under curve (AUC), accuracy, geometric mean, f1 score, mean absolute error, mean squared error, sensitivity, specificity, etc.) to find the optimal parameters of the physics constrained machine learning model.

While FIGS. 1 and 2 show various configurations of components, other configurations may be used without departing from the scope of the disclosure. For example, one or more of the individual components shown in FIGS. 1 and 2 may be omitted, repeated, and/or disposed in a location different than that shown in FIGS. 1 and 2. Accordingly, the scope of the invention should not be limited by the specific arrangement as depicted in FIGS. 1 and 2.

Figure 3:
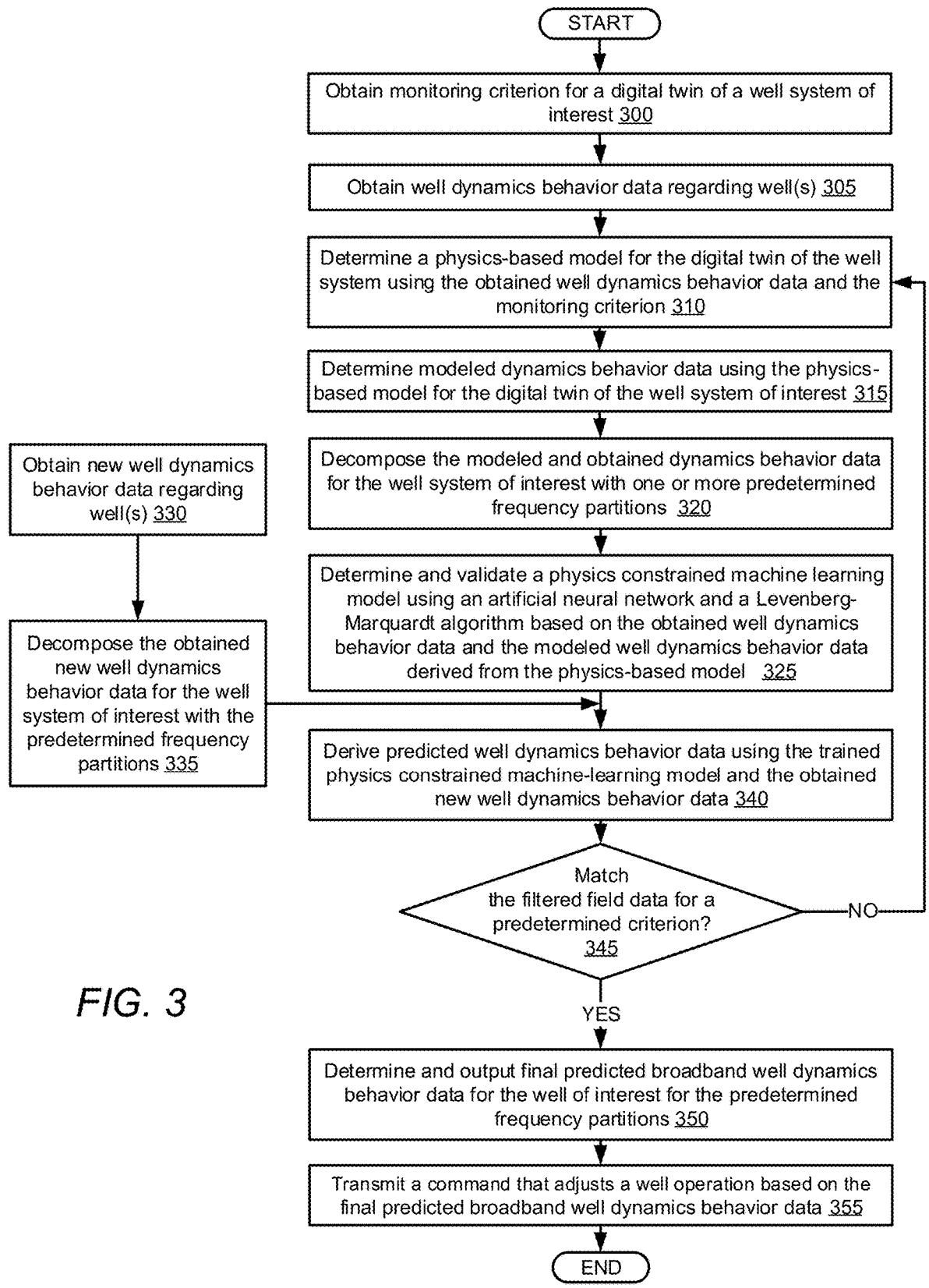
FIG. 3 shows a flowchart in accordance with one or more embodiments.

FIG. 3 shows a flowchart in accordance with one or more embodiments. Specifically, FIG. 3 describes a general method for predicting broadband well dynamics behavior gradually from low frequency to high frequency for a digital twin of a well system in accordance with one or more embodiments. One or more blocks in FIG. 3 may be performed by one or more components (e.g., digital twin manager (160)) as described in FIGS. 1 and 2. While the various blocks in FIG. 3 are presented and described sequentially, one of ordinary skill in the art will appreciate that some or all of the blocks may be executed in different orders, may be combined or omitted, and some or all of the blocks may be executed in parallel. Furthermore, the blocks may be performed actively or passively.

In Block 300, a monitoring criterion is obtained for a digital twin of a well system of interest in accordance with one or more embodiments. For example, the digital twin manager may obtain a monitoring criterion defined by a user via a user interface.

In Block 305, well dynamics behavior data are obtained for one or more wells in accordance with one or more embodiments. For example, the well dynamics behavior data may include mass flow, pressure, and/or temperature for a well system of interest. As another example, the well dynamics behavior data may be similar to the well dynamics behavior data described above in FIG. 1 and the accompanying description. As another example, the digital twin manager may obtain the well dynamics behavior data from a database that stores six months of well dynamics behavior data which contain both normal operation conditions and shut-down conditions for the well system of interest.

In Block 310, a physics-based model is determined for the digital twin of the well system using the obtained well dynamics behavior data and the monitoring criterion in accordance with one or more embodiments. In some embodiments, the physics-based model includes various sensors which determine multiple well activities (e.g., well-sand GPU flow resistance, mass flow rate, energy flow rate, density flow rate, temperature*density flow rate, pressure, temperature, midstream chamber, well head, midstream flow resistance, well check valve, well temperature, reservoir temperature, reservoir flow restriction, constant volume reservoir, reservoir pressure, etc.) that are required to emulate well dynamics behavior below a predetermined frequency (e.g., a value of "0.01" Hz) based on the predetermined monitoring criterion for the digital twin of the well system of interest. For example, a physics-based model may be similar to the physics-based model described below with respect to FIG. 4 and the accompanying description.

In Block 315, modeled well dynamics behavior data are determined using the physics-based model for the digital twin of the well system of interest in accordance with one or more embodiments. For example, a physics-based model server emulates the well dynamics behavior data below the predetermined frequency of the physics-based model based on one or more user selections defined by a user via a user interface. As another example, the user may modify the user selections for the physics-based model to adjust the modeled well dynamics behavior based on the predetermined monitoring criterion.

In Block 320, the modeled and obtained dynamics behavior data are decomposed for the well system of interest with one or more predetermined frequency partitions in accordance with one or more embodiments. A filter is applied decompose the modeled and obtained dynamics behavior data into one or more narrow frequency bands. The filter may be a Butterworth filter, a Chebyshev filter, a Gaussian filter, a Bessel filter, an Elliptic filter, or a raised-cosine filter. In one or more embodiments, the predetermined frequency partitions are one or more narrow frequency bands with at least partially overlapping frequency ranges from low frequency to high frequency (e.g., determined from prior experience or based on the monitoring criterion). For example, the predetermined narrow frequency bands may include five frequency partitions with overlapping endpoints: "0-0.01" Hz, "0.01-0.02" Hz, "0.02-0.03" Hz, "0.03-0.04" Hz, "0.04-0.05" Hz. As another example, the predetermined narrow frequency bands may be similar to frequency partitions described below in FIG. 6B (i.e., completely overlapping ranges) and the accompanying description.

In Block 325, a physics constrained machine learning model is determined and validated using an artificial neural network and a Levenberg-Marquardt algorithm based on the obtained well dynamics behavior data and the modeled well dynamics behavior data derived from the physics based model in accordance with one or more embodiments. In some embodiments, the digital twin manager trains one or more models using a ML algorithm (e.g., an artificial neural network) to determine well dynamics behavior for one or more narrow frequency bands from low frequency to high frequency for a well system of interest. For example, the digital twin manager applies the Levenberg-Marquardt algorithm to train a model to emulate well dynamics behavior for a narrow frequency band (e.g., a range of "0-0.01" Hz) of the well system of interest. For example, the digital twin manager applies the Levenberg-Marquardt algorithm to train a different model to emulate well dynamics behavior for a different narrow frequency band (e.g., a range of "0-0.05" Hz) of the well system of interest. In particular, the digital twin manager applies the model to predict the well dynamics behavior $y^{Mflow}(t)$, $y^{Pflow}(t)$, and $y^T(t)$ at time t based on the input well dynamics behavior data over a considered horizon d (e.g., a value of "10" seconds) (Equations 1, 2, and 3).

$$y^{Mflow}(t) = f^{Mflow}(x(t), x(t-1), \ldots, x(t-d)) \quad \text{Equation 1}$$

$$y^{Pflow}(t) = f^{Pflow}(x(t), x(t-1), \ldots, x(t-d)) \quad \text{Equation 2}$$

$$y^T(t) = f^T(x(t), x(t-1), \ldots, x(t-d)) \quad \text{Equation 3}$$

where $y^{Mflow}(t)$ is the predicted well mass flow at time t; $y^{Pflow}(t)$ is the predicted pressure at time t; $y^T(t)$ is the predicted temperature at time t; $f^{Mflow}$ is the function to predict well mass flow using input well dynamics behavior, $f^{Pflow}$ is the function to predict pressure using input well dynamics behavior, $f^T$ is the function to predict temperature using input well dynamics behavior, x(t) is a vector of input well dynamics behavior from the well system of interest and the physics-based model; and d is a considered horizon or time delay in seconds.

Furthermore, the digital twin manager validates the physics constrained machine learning algorithm at Block 325. For example, the digital twin manager may apply a nested k-fold inner/outer cross-validation to tune and validate the optimal parameters of the physics constrained machine learning model. As another example, the digital twin manager may validate the physics constrained machine learning model by using the well dynamics behavior prediction error (e.g., ISE, ME, normalized ISE, normalized ME) between the predicted well dynamics behavior data based on a physics constrained machine learning model and the field well dynamics behavior for a well system of interest. ISE measures system performance by integrating the square of the difference between predicted well dynamics behavior determined by the model and the field well dynamics behavior data over a fixed interval of time (Equation 4). ME measures average system performance by averaging the integral of the absolute value of the difference between predicted well dynamics behavior determined by the model and the field well dynamics behavior data over a fixed interval of time (Equation 5). Normalized ISE measures the ISE value normalized by the final value of the ISE by the same physics-based model used by the digital twin of the well system (Equation 6). Normalized ME measures the ME value normalized by the final value of the ME by the same physics-based model used by the digital twin of the well system (Equation 7). For example, the physics constrained machine learning model is valid when the normalized ISE for the physics constrained machine learning model is less than a threshold (e.g., a value of "1"). As another example, the physics constrained machine learning model is valid when the normalized ME is less than a threshold (e.g., a value of "1").

$$ISE(t) = \int_{t1}^{t} (y(t) - d(t))^2 dt \quad \text{Equation 4}$$

$$ME = \frac{1}{t2 - t1} \int_{t1}^{t2} |y(t) - d(t)| dt \quad \text{Equation 5}$$

$$ISE^N(t) = \frac{1}{ISE_{ph-based}(t2)} \int_{t1}^{t} (y(t) - d(t))^2 dt \quad \text{Equation 6}$$

$$ME^N = \frac{1}{(t2 - t1)ME_{ph-based}} \int_{t1}^{t2} |y(t) - d(t)| dt \quad \text{Equation 7}$$

where y(t) is the predicted well dynamics behavior at time t by a physics constrained machine learning model; d(t) is the field well dynamics behavior at time t from a well system of interest; ISE(t) is the integral square error at time t; ME is the mean error from time t1 to t2; $ISE^N(t)$ is the integral square error at time t normalized by the final value $ISE_{ph-based}(t2)$ of the ISE by the same physics-based model used by the digital twin of the well system; $ME^N$ is the mean error normalized by the final value $ME_{ph-based}$ of the ME by the same physics-based model used by the digital twin of the well system.

In Block 330, new well dynamics behavior data are obtained for one or more wells in accordance with one or more embodiments. For example, the new well dynamics behavior data may be similar to the well dynamics behavior data described above in FIG. 1 and the accompanying description.

In Block 335, the obtained new well dynamics behavior data may be decomposed for the well system of interest with the predetermined frequency partitions in accordance with one or more embodiments. For example, a filter is applied decompose the obtained new dynamics behavior data into the same predetermined narrow frequency bands used in Block 320. The filter may be a Butterworth filter, a Chebyshev filter, a Gaussian filter, a Bessel filter, an Elliptic filter, or a raised-cosine filter.

In Block 340, predicted well dynamics behavior data are determined using the trained physics constrained machine learning model, the physics-based model and the obtained new well dynamics behavior data in accordance with one or more embodiments. For example, the digital twin manager applies the physics constrained machine learning model to emulate the well dynamics behavior data for a predetermined frequency partition based on modeled well dynamics behavior data for the same predetermined frequency partition determined using the physics-based model (Equations 1, 2, and 3). As another example, the digital twin manager emulates the well dynamics behavior data gradually from low frequency to high frequency. In particular, the digital twin manager applies the physics constrained machine learning model to predict well dynamics behavior data above the predetermined frequency of the physics-based model based on the well dynamics behavior below the predetermined frequency of the physics-based model. In one or more embodiments, the physics constrained machine learning model iteratively predicts narrow frequency bands components of the predict well dynamics behavior data from the lowest frequency narrow band partition to the highest frequency narrow band partition.

In Block 345, a determination is made whether the predicted well mass dynamics behavior data match collected field data for a predetermined evaluation criterion in accordance with one or more embodiments. The collected field data may be filtered (e.g., based on the predetermined frequency, based on one or more predetermined frequency partitions). For example, the digital twin manager applies the physics constrained machine learning model to emulate the well dynamics behavior data at time t for a well system of interest based on a predetermined criterion. When a value of the misfit function is smaller than a predetermined criterion (e.g., 5% of the initial misfit function value), the predicted well dynamics behavior data using the physics constrained machine learning model is determined to match the collected field data obtained from the well system of interest. As another example, when the difference between the predicted well dynamics behavior data using the physics constrained machine learning model and the collected field data obtained from the well system of interest is smaller than a predetermined criterion (e.g., a value of "50" kg/s), the predicted well dynamics behavior data using the physics constrained machine learning model is determined to match the collected field data obtained from the well system of interest. Where it is determined that the predicted well dynamics behavior data using the physics constrained machine learning model matches the filtered field data obtained from the well system of interest, the process may proceed to Block 350. Where it is determined that the predicted well dynamics behavior data using the physics constrained machine learning model does not match the collected field data obtained from the well system of interest, the process may proceed to Block 310 where the physics-based model is adjusted and optimized.

In Block 350, final predicted broadband well dynamics behavior data are determined and outputted for the well of interest for the predetermined frequency partitions in accordance with one or more embodiments. The final predicted broadband well dynamics behavior data are merged by a straight or weighted summation based on the predicted well dynamics behavior data for one or more narrow frequency bands for the well of interest. Thus, the determined broadband final predicted well dynamics behavior data are applied to build accurate manufacturing scheduling to optimize resource service allocation and management for predictive maintenance purposes. For example, in Block 355, the digital twin manager sends a command to the well system of interest to maintain normal operation based on the predicted well dynamics behavior data using the physics constrained machine learning model. As another example, the digital twin manager sends a command to the well system of interest to apply an operation to resolve system faults, system failures, and system shut-downs based on the predicted well dynamics behavior data using the physics constrained machine learning model.

Figure 4:
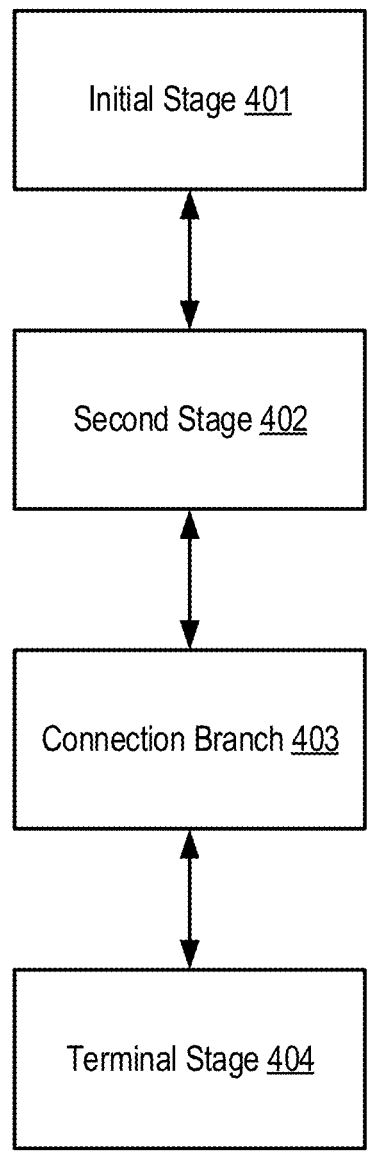
FIG. 4 shows an example in accordance with one or more embodiments.

FIG. 4 provides an example of a physics-based model in accordance with one or more embodiments. The following example is for explanatory purposes only and not intended to limit the scope of the disclosed technology. While the various blocks in FIG. 4 are presented and described sequentially, one of ordinary skill in the art will appreciate that some or all of the blocks may be organized in different orders, may be combined or omitted, and some or all of the blocks may be repeated in serial or parallel. Accordingly, the scope of the invention should not be limited by the specific arrangement as depicted in FIG. 4.

In FIG. 4, a physics-based model includes an initial stage (401), a second stage (402), a connection branch (403), and a terminal stage (404). Using the physics-based model, the digital twin manager determines a modeled dynamics behavior data (e.g., mass flow, pressure, and temperature) based on the underlying data inputs from the well measurements in a well subsystem. Each of these stages is described in further detail below.

In the physics-based model, the initial stage (401) includes a controlled reservoir module (i.e., a module emulating an infinite reservoir at a variable pressure and temperature). In some embodiments, the initial stage (401) further includes a reservoir flow restriction module (i.e., a module emulating a general pressure drop between the reservoir and the well subsystem). The initial stage (401) may include an input for the reservoir temperature from well data. The initial stage (401) may include various sensors (e.g., mass & energy flow rate sensor, pressure sensor, temperature sensor, etc.) to obtain various measurements (e.g., mass flow, energy flow, pressure, temperature, heat, and enthalpy, etc.) from a well subsystem to replicate the dynamics behavior from the reservoir in normal operating conditions for the well subsystem.

In the physics-based model, the second stage (402) is connected to the initial stage (401) to simulate components of a well subsystem between the reservoir and the output of the well subsystem. The second stage (402) may include a constant volume chamber (i.e., a module emulating the accumulation of mass and energy in a fixed volume) as a midstream chamber. In some embodiments, the second stage (402) further includes a midstream flow restriction module (i.e., a module emulating a general pressure drop within the well subsystem). The second stage (402) may include an input for one or more temperatures of components in the well subsystem from well data. The second stage (402) may include various sensors (e.g., mass & energy flow rate sensor, pressure sensor, temperature sensor, etc.) to obtain various measurements (e.g., mass flow, energy flow, pressure, temperature, heat, and enthalpy, etc.) from the well subsystem to replicate the dynamics behavior of the midstream chamber in normal operating conditions for the well subsystem.

In the physics-based model, the connection branch (403) is connected to the second stage (402) to simulate components of a well subsystem between the midstream chamber and the well head of the well subsystem. The connection branch (403) may include one or more well check valve modules that emulate valve and control mechanisms of the well subsystem (e.g., rotary valves, ball valves, linear globe valves, etc.). The connection branch (403) may include various sensors (e.g., mass & energy flow rate sensor, pressure sensor, temperature sensor, etc.) to obtain various measurements (e.g., mass flow, energy flow, pressure, temperature, heat, and enthalpy, etc.) from the well subsystem to replicate the dynamics behavior between the midstream chamber and well head in normal operating conditions for the well subsystem.

In the physics-based model, the terminal stage (404) is connected to the connection branch (403) to simulate the well head and output of the well subsystem. The terminal stage (404) may include a constant volume chamber (i.e., a module emulating the accumulation of mass and energy in a fixed volume) as the well head. In some embodiments, the terminal stage (404) may further include a well-sand GPU flow restriction module (i.e., a module emulating a general pressure drop between the well head and the output of the well subsystem). The terminal stage (404) may include various sensors (e.g., mass & energy flow rate sensor, pressure sensor, temperature sensor, etc.) to obtain various measurements (e.g., mass flow, energy flow, pressure, temperature, heat, and enthalpy, etc.) from the well subsystem to replicate the dynamics behavior at the well head and the well subsystem output in normal operating conditions.

Furthermore, additional modules such as additional valves and thermal resistances may be included throughout the various sections of the physics-based model to replicate the effects of other well equipment and to simulate heat flow through the well subsystem.

FIG. 5A shows an example of field well mass flow data (501). FIG. 5B shows an example of modeled well mass flow data (505) determined based on a physics-based model. FIG. 5C shows an example of modeled well pressure data (510) determined based on a physics-based model.

Figure 6A:
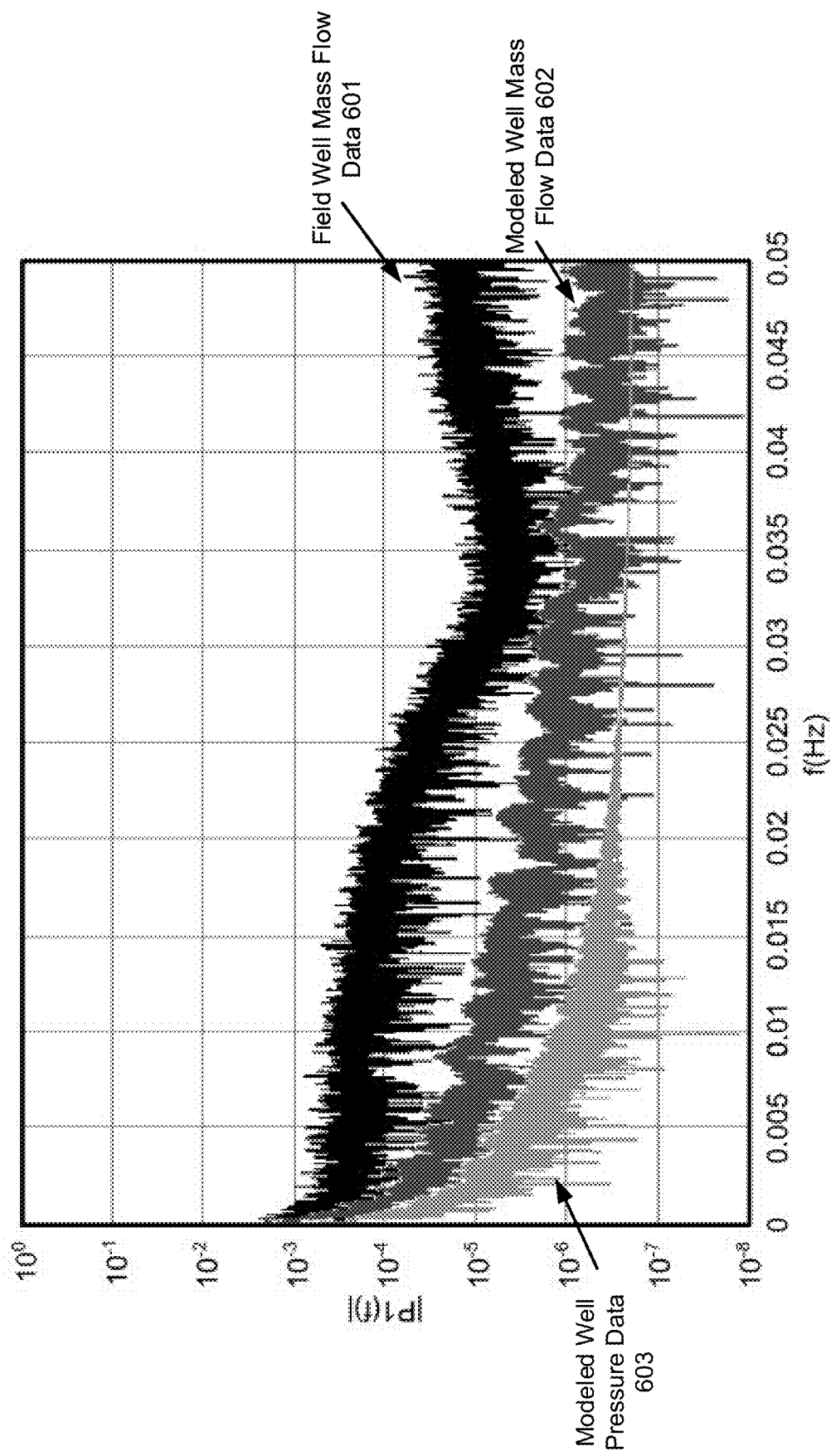
FIGS. 6A and 6B show examples in accordance with one or more embodiments.

FIG. 6A shows the field well mass flow data (601) have both a low frequency component (e.g., a range of "0-0.03" Hz) and a high frequency component (e.g., a range of "0.03-0.05" Hz) for input data with a sample rate of "1/10" sample/seconds. The modeled well mass flow data (602) and modeled pressure data (603) based on a physics-based model have a low frequency component (e.g., a range of "0-0.01" Hz).

Figure 6B:
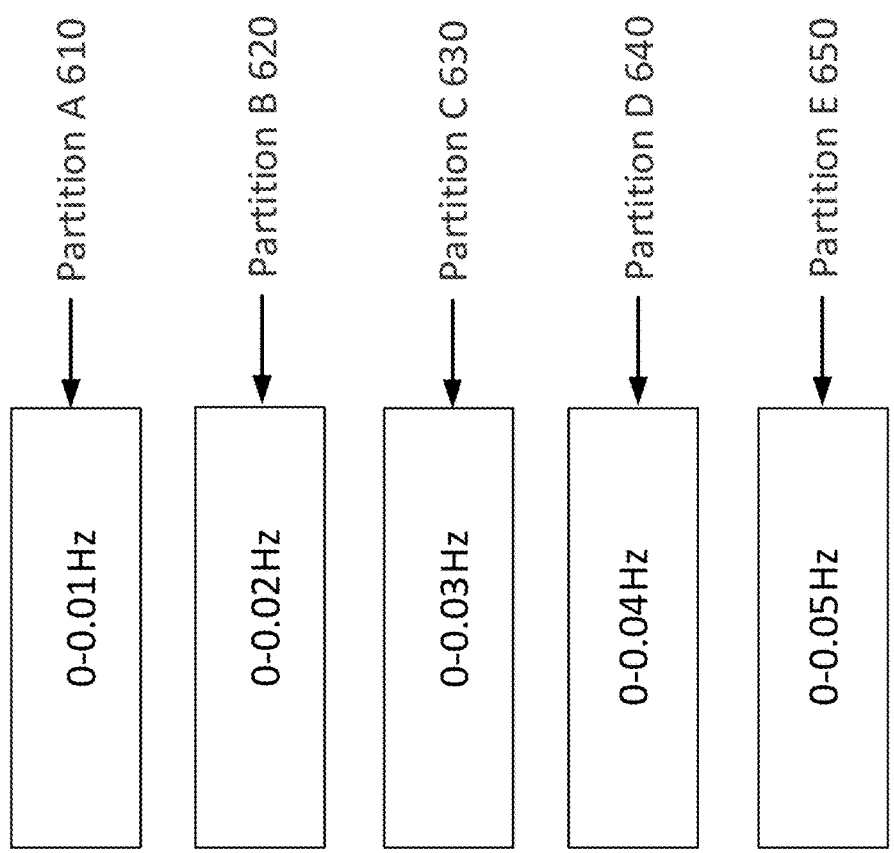

FIG. 6B shows the predetermined five narrow frequency bands (e.g., partition A (610) for a range of "0-0.01" Hz, partition B (620) for a range of "0-0.02" Hz, partition C (630) for a range of "0-0.03" Hz, partition D (640) for a range of "0-0.04" Hz, and partition E (650) for a range of "0-0.05" Hz) that the digital twin manager uses to predict broadband well dynamics behavior data based on field well mass flow data, modeled well mas flow data, and modeled well pressure data, according to one or more embodiments. The predetermined frequency partitions may be changed to include one or more other narrow frequency bands with overlapping frequency ranges below the predetermined frequency of the physics-based model (e.g., a value of "0.05" Hz).

Figure 7A:
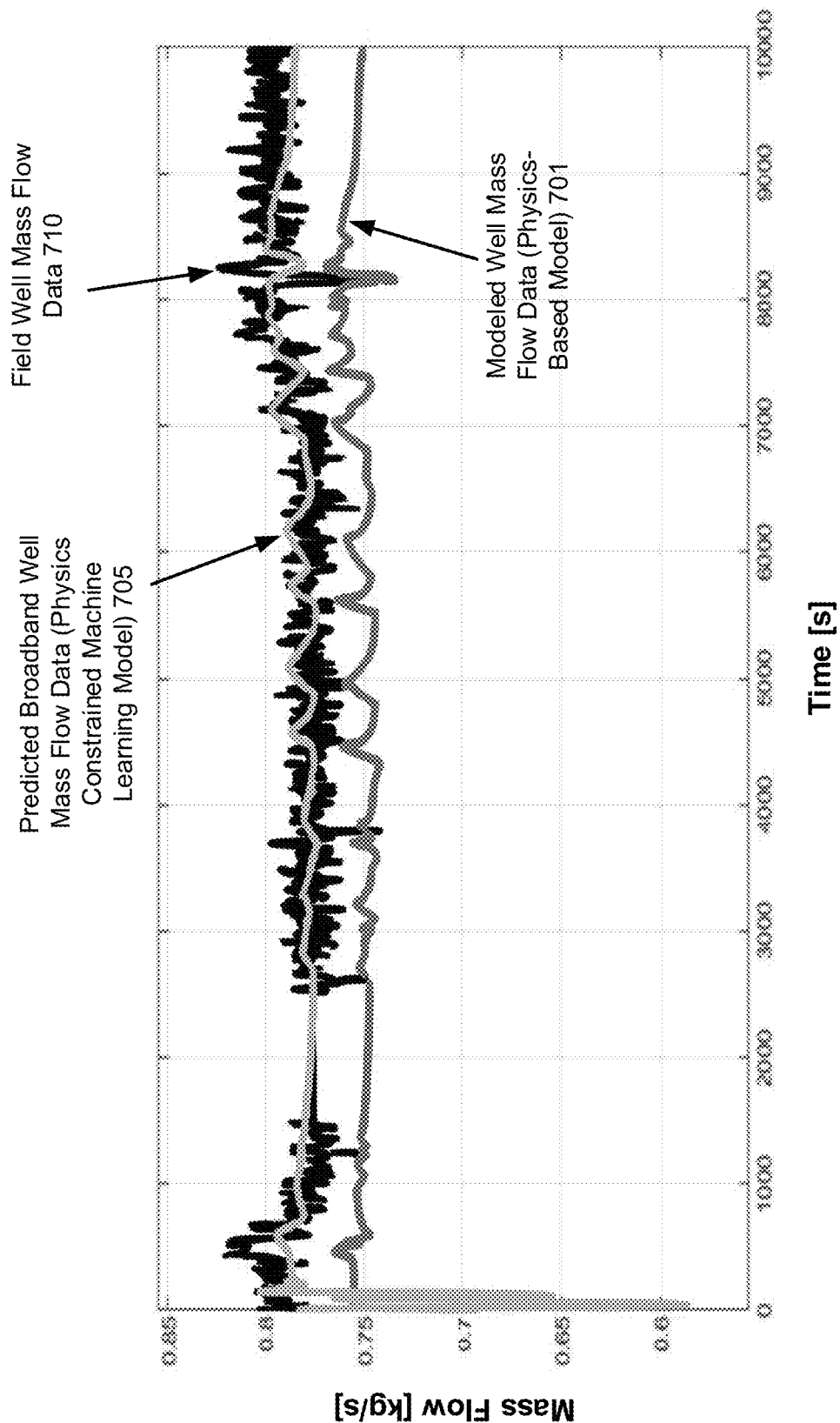
FIGS. 7A and 7B show examples in accordance with one or more embodiments.

FIG. 7A shows a modeled well mass flow data determined based on a physics-based model (701), a predicted broadband well mass flow determined by a physics constrained machine learning model (705) and five predetermined frequency partitions gradually from a low frequency band of "0-0.01" Hz to a high frequency band of "0-0.05" Hz, and field well mass flow data (710). The modeled well mass flow data (701) may match components below a predetermined frequency (e.g., a value of "0.01" Hz) in the field well mass flow data (710). On the other hand, the predicted broadband well mass flow data (705) obtained by using an artificial neural network, a Levenberg-Marquardt algorithm, and the physics-based model may emulate the high resolution behavior of field well mass flow data (710). For example, the coupling of the field well mass flow data (710) and the modeled well mass flow data (701) as inputs to the physics constrained machine learning model may replicate the noise and/or disturbances related to nonlinear dynamics of the well system of interest. The good match between the predicted well mass flow data determined by a physics constrained machine learning model (705) and field well mass flow data (710) also shows the physics constrained machine learning model is a valid generalized model.

Figure 7B:
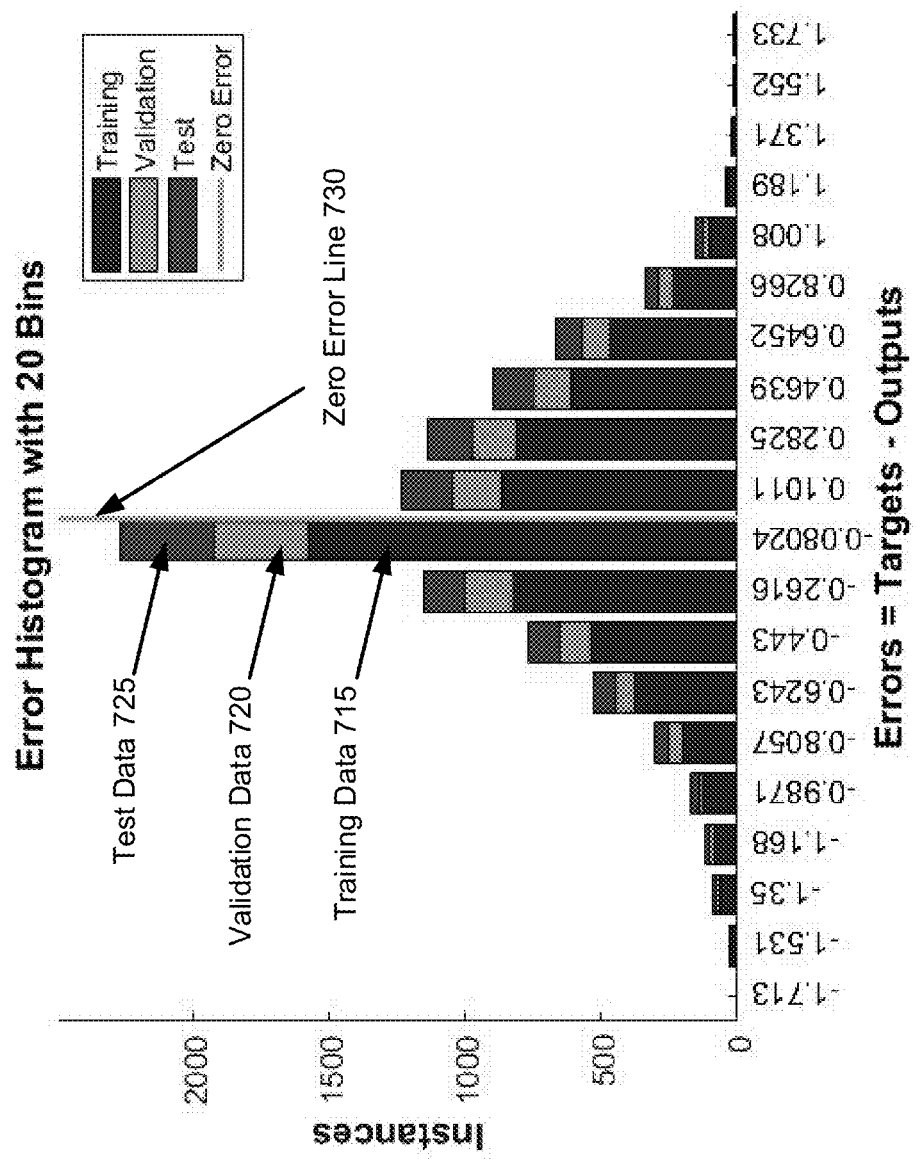

FIG. 7B shows the validation result of applying the physics constrained machine learning model on training data (715), validation data (720), and test data (725). The histogram of the prediction error between the predicted well mass flow data determined by a physics constrained machine learning model (705) and field well mass flow data (710) is close and centered to the zero error line (730).

Figure 8A:
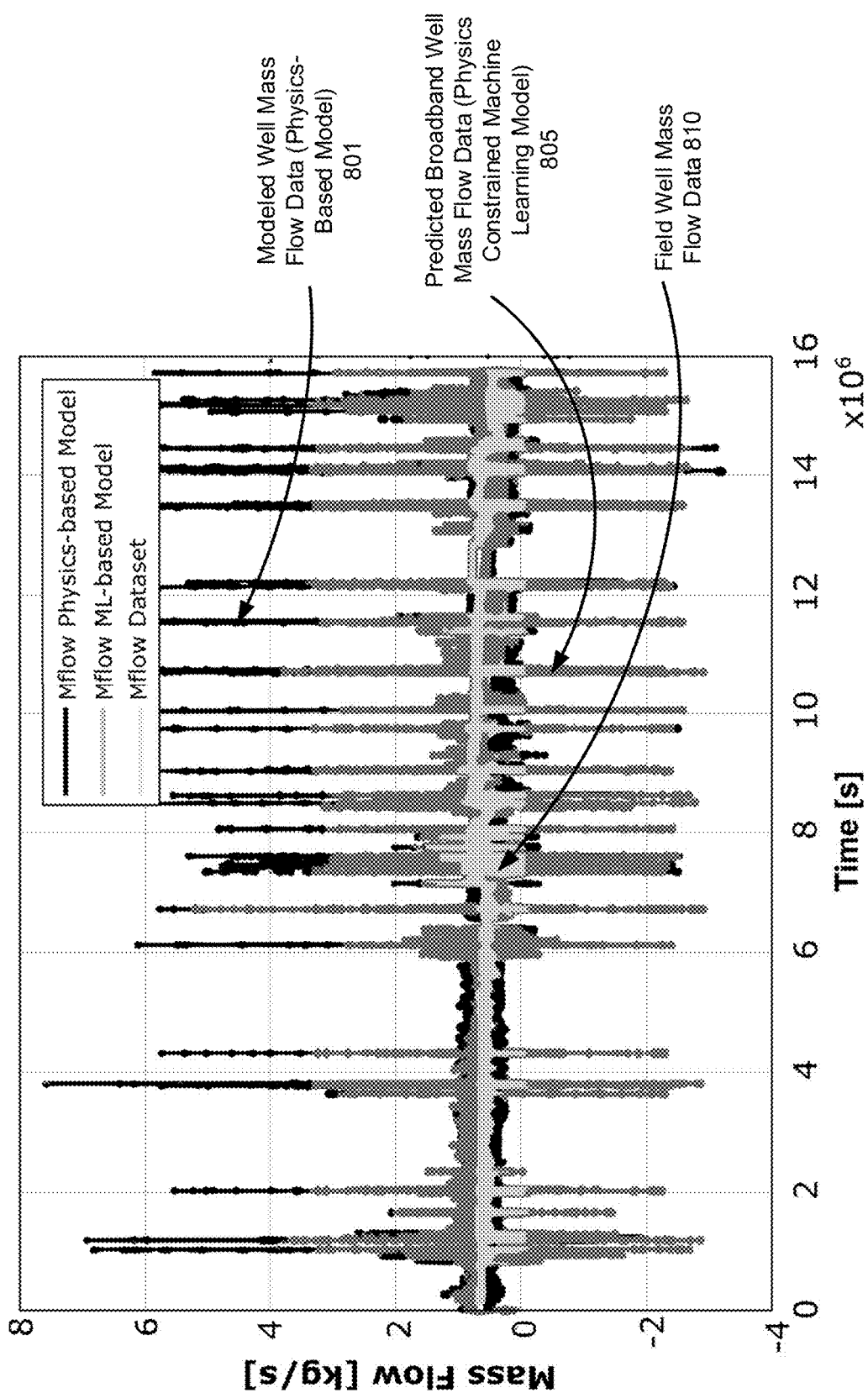
FIGS. 8A and 8B show examples in accordance with one or more embodiments.

FIG. 8A shows another example of modeled well mass flow data determined based on a physics-based model (801), predicted broadband well mass flow data determined by a physics constrained machine learning model (805), and field well mass flow data (810). The predicted broadband well mass flow data determined by a physics constrained machine learning model (805) improves the high resolution behavior of field well mass flow data (810) than the modeled well mass flow data (801).

Figure 8B:
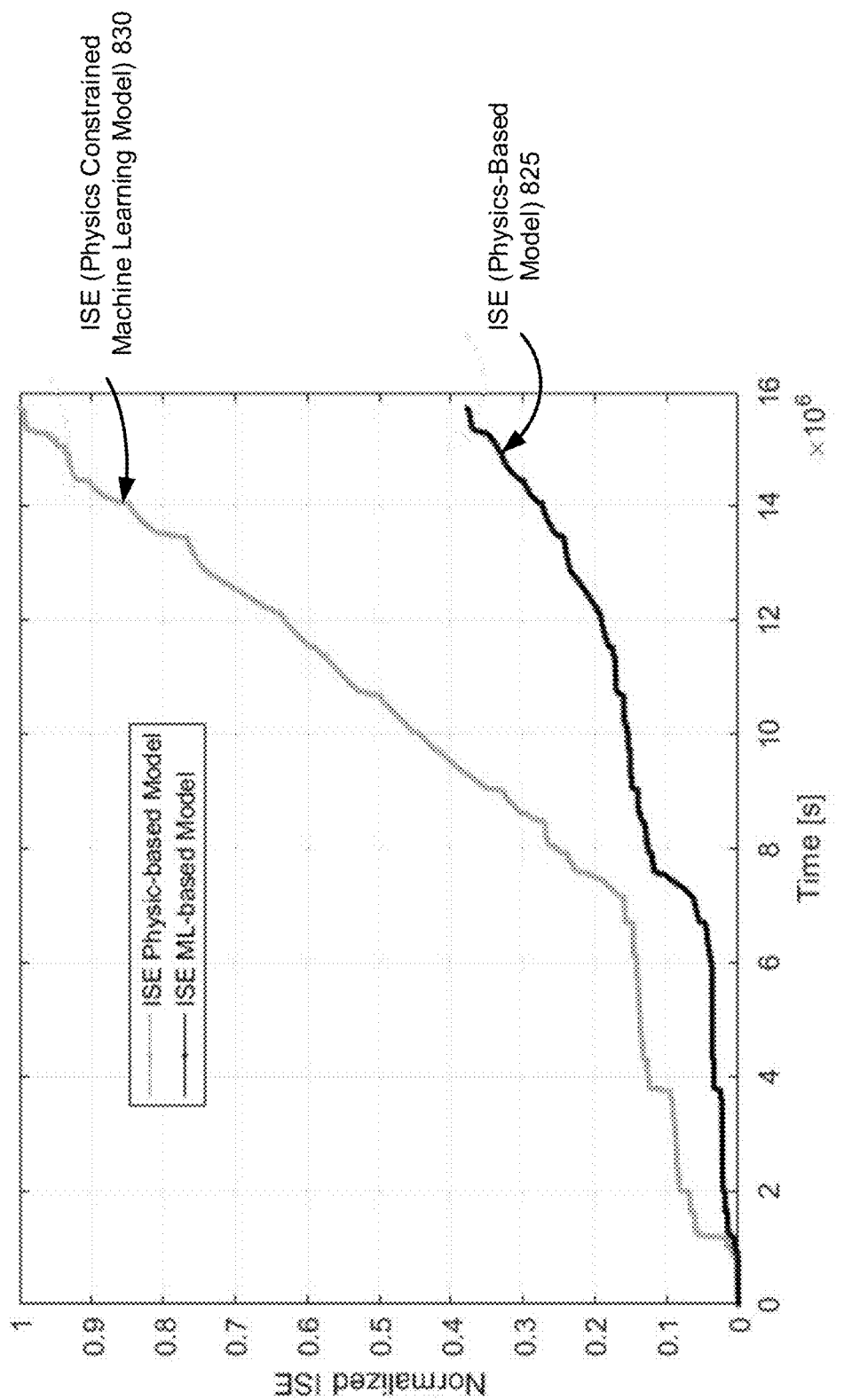

FIG. 8B shows an example of a well performance comparison of normalized ISE between a physics-based model (825) and a physics constrained machine learning model (830). The final normalized ISE related to the physics constrained machine learning model (830) is 62.49% less than the final normalized ISE related to the physics-based model (825) for the well system of interest (i.e., a normalized ISE improvement of +62.49%). The final ME related to the physics constrained machine learning model (830) has a mean error of 0.0678 kg/s with a standard deviation of 0.1244. As a comparison, the final ME related to the physics-based model (825) has a mean error of 0.1419 kg/s with a standard deviation of 0.1945. In other words, the final ME related to the physics constrained machine learning model (830) is 52.22% less than the final ME related to the physics-based model (825) for the well system of interest (i.e., a ME improvement of +52.22%).

Figure 9:
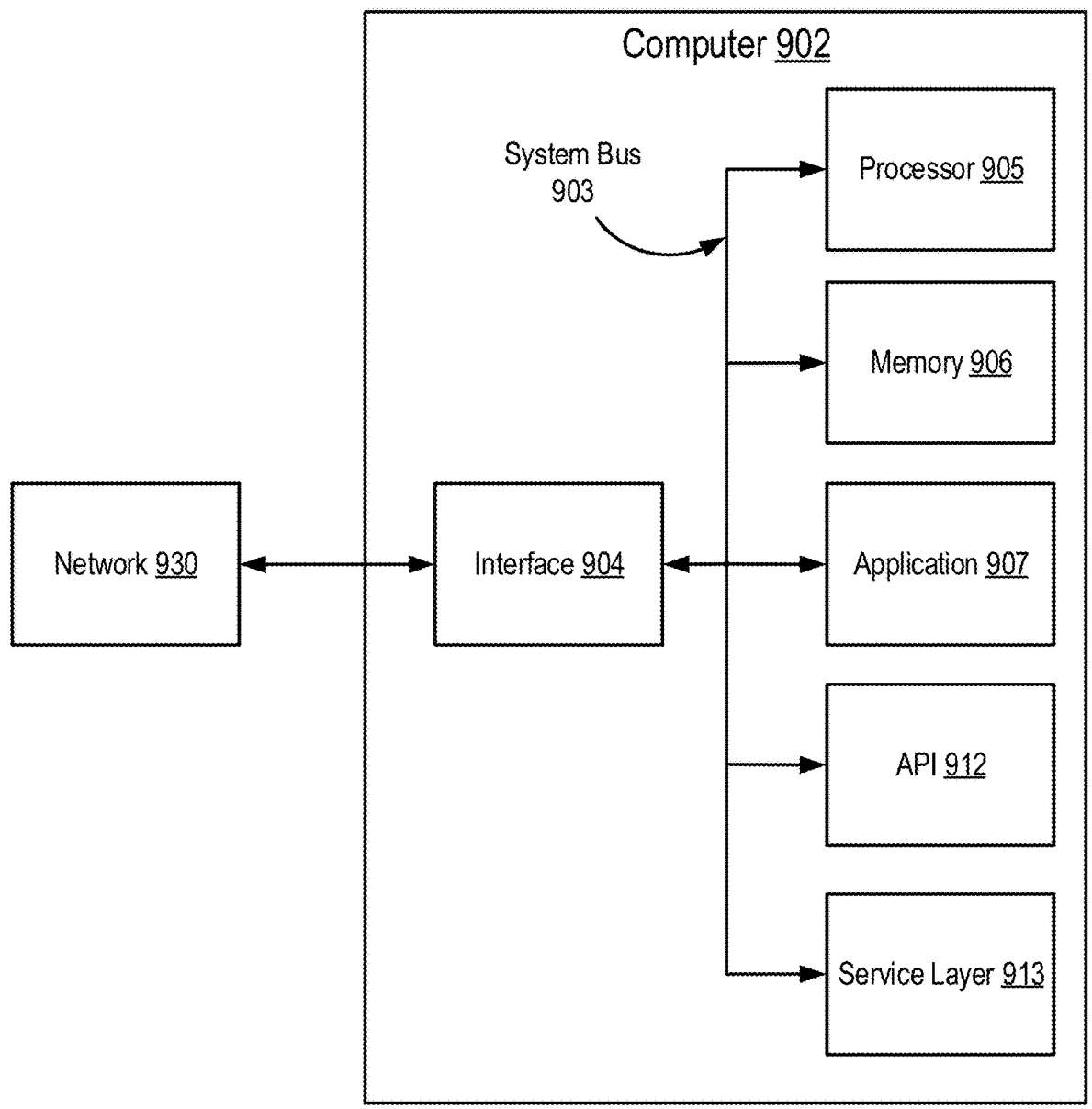
FIG. 9 shows a computer system in accordance with one or more embodiments.

FIG. 9 is a block diagram of a computer system (902) used to provide computational functionalities associated with described algorithms, methods, functions, processes, flows, and procedures according to one or more embodiments. The illustrated computer (902) is intended to encompass any computing device such as a high performance computing (HPC) device, a server, desktop computer, laptop/notebook computer, wireless data port, smart phone, personal data assistant (PDA), tablet computing device, one or more processors within these devices, or any other suitable processing device, including both physical or virtual instances (or both) of the computing device. Additionally, the computer (902) may include an input device, such as a keypad, keyboard, touch screen, or other device that can accept user information, and an output device that conveys information associated with the operation of the computer (902), including digital data, visual information, audio information, a graphical user interface (GUI), or any combination thereof.

The computer (902) can serve in a role as a client, network component, a server, a database or other persistency, or any other component (or a combination of roles) of a computer system for performing the subject matter described in the instant disclosure. The illustrated computer (902) is communicably coupled with a network (930). In some implementations, one or more components of the computer (902) may be configured to operate within environments, including cloud-computing-based, local, global, other environments, or any combination of environments.

At a high level, the computer (902) is an electronic computing device operable to receive, transmit, process, store, or manage data and information associated with the described subject matter. According to some implementations, the computer (902) may also include or be communicably coupled with an application server, e-mail server, web server, caching server, streaming data server, business intelligence (BI) server, or other server (or a combination of servers).

The computer (902) can receive requests over network (930) from a client application (for example, executing on another computer (902)) and responding to the received requests by processing the said requests in an appropriate software application. In addition, requests may also be sent to the computer (902) from internal users (for example, from a command console or by other appropriate access method), external or third-parties, other automated applications, as well as any other appropriate entities, individuals, systems, or computers.

Each of the components of the computer (902) can communicate using a system bus (903). In some implementations, any or all of the components of the computer (902), both hardware or software (or a combination of hardware and software), may interface with each other and/or the interface (904) over the system bus (903) using an application programming interface (API) (912) or a service layer (913), or any combination thereof. The API (912) may include specifications for routines, data structures, and object classes. The API (912) may be either computer-language independent or dependent and refer to a complete interface, a single function, or even a set of APIs. The service layer (913) provides software services to the computer (902) or other components that are communicably coupled to the computer (902). The functionality of the computer (902) may be accessible for all service consumers using this service layer. Software services, such as those provided by the service layer (913), provide reusable, defined business functionalities through a defined interface. For example, the interface may be software written in JAVA, C++, or any other suitable language providing data in extensible markup language (XML) format or any other suitable format. While illustrated as an integrated component of the computer (902), alternative implementations may illustrate the API (912) or the service layer (913) as stand-alone components in relation to other components of the computer (902) or other components of the network (930) that that are communicably coupled to the computer (902). Moreover, any or all parts of the API (912) or the service layer (913) may be implemented as child or sub-modules of another software module, enterprise application, or hardware module without departing from the scope of this disclosure.

The computer (902) includes an interface (904). Although illustrated as a single interface (904) in FIG. 9, two or more interfaces (904) may be used according to particular needs, desires, or particular implementations of the computer (902). The interface (904) is used by the computer (902) for communicating with other systems in a distributed environment that are connected to the network (930). Generally, the interface (904) includes logic encoded in software, hardware, or any combination thereof and is operable to communicate with the network (930). More specifically, the interface (904) may include software supporting one or more communication protocols associated with communications such that the network (930) or interface's hardware is operable to communicate physical signals within and outside of the illustrated computer (902).

The computer (902) includes at least one computer processor (905). Although illustrated as a single computer processor (905) in FIG. 9, two or more processors may be used according to particular needs, desires, or particular implementations of the computer (902). Generally, the computer processor (905) executes instructions and manipulates data to perform the operations of the computer (902) and any algorithms, methods, functions, processes, flows, and procedures as described in the instant disclosure.

The computer (902) also includes a memory (906) that holds data for the computer (902) or other components (or a combination of both) that can be connected to the network (930). For example, memory (906) can be a database storing data consistent with this disclosure. Although illustrated as a single memory (906) in FIG. 9, two or more memories may be used according to particular needs, desires, or particular implementations of the computer (902) and the described functionality. While memory (906) is illustrated as an integral component of the computer (902), in alternative implementations, memory (906) can be external to the computer (902).

The application (907) is an algorithmic software engine providing functionality according to particular needs, desires, or particular implementations of the computer (902), particularly with respect to functionality described in this disclosure. For example, application (907) can serve as one or more components, modules, applications, etc. Further, although illustrated as a single module, the application (907) may be implemented as multiple applications (907) on the computer (902). In addition, although illustrated as integral to the computer (902), in alternative implementations, the application (907) can be external to the computer (902).

There may be any number of computers (902) associated with, or external to, a computer system containing computer (902), each computer (902) communicating over network (930). Further, the term "client," "user," and other appropriate terminology may be used interchangeably as appropriate without departing from the scope of this disclosure. Moreover, this disclosure contemplates that many users may use one computer (902), or that one user may use multiple computers (902).

In some embodiments, the computer (902) is implemented as part of a cloud computing system. For example, a cloud computing system may include one or more remote servers along with various other cloud components, such as cloud storage units and edge servers. In particular, a cloud computing system may perform one or more computing operations without direct active management by a user device or local computer system. As such, a cloud computing system may have different functions distributed over multiple locations from a central server, which may be performed using one or more Internet connections. More specifically, cloud computing system may operate according to one or more service models, such as infrastructure as a service (IaaS), platform as a service (PaaS), software as a service (SaaS), mobile "backend" as a service (MBaaS), serverless computing, artificial intelligence (AI) as a service (AIaaS), and/or function as a service (FaaS).

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

What is claimed is:

1. A method of managing a well system, comprising:
   obtaining, by a digital twin manager and based on a predetermined monitoring criterion, well dynamics behavior data of the well system;
   obtaining, by the digital twin manager, modeled well dynamics behavior data for the well system using a physics-based model, wherein the physics-based model includes a valve module that corresponds to and emulates a control mechanism of the well system;
   decomposing, by the digital twin manager, each of the well dynamics behavior data and the modeled well dynamics behavior data into a plurality of frequency band components based on a plurality of predetermined frequency partitions;
   training, by the digital twin manager, a physics constrained machine learning model using one or more machine learning algorithms based on the plurality of frequency band components of the decomposed well dynamics behavior data and the decomposed modeled well dynamics behavior data as input data;
   obtaining, by the digital twin manager, new well dynamics behavior data of the well system;
   using the physics constrained machine learning model and the physics-based model, by the digital twin manager, to generate and output predicted well dynamics behavior data based on the new well dynamics behavior data; and
   transmitting, by the digital twin manager, a command to the well system that adjusts the control mechanism of the well system based on the predicted well dynamics behavior data,
   wherein the predicted well dynamics behavior data are predicted in frequency band components corresponding to the plurality of predetermined frequency partitions,
   wherein the plurality of predetermined frequency partitions increase in size from a smallest predetermined frequency partition to a largest predetermined frequency partition,
   wherein a frequency range of the smallest predetermined frequency partition is entirely included in each of the plurality of predetermined frequency partitions, and
   wherein the physics constrained machine learning model iteratively predicts the predicted frequency band components from the smallest predetermined frequency partition to the largest predetermined frequency partition that includes the frequency range of the smallest predetermined frequency partition.

2. The method of claim 1,
   wherein the physics-based model emulates components of the well dynamics behavior data that are below a predetermined frequency,
   wherein the physics constrained machine learning model is trained to predict components of the well dynamics behavior data that are above the predetermined frequency, and
   wherein the predicted frequency band components of the predicted well dynamics behavior data are merged by a straight or weighted summation.

3. The method of claim 2,
   wherein the predetermined frequency is determined by the physics-based model based on the predetermined monitoring criterion, and
   wherein the plurality of frequency band components of the decomposed well dynamics behavior data and the decomposed modeled well dynamics behavior data are obtained using a filter selected from a group consisting of a Butterworth filter, a Chebyshev filter, a Gaussian filter, a Bessel filter, an Elliptic filter, and a raised-cosine filter.

4. The method of claim 1,
   wherein the command to the well system includes manufacturing scheduling information to perform predictive maintenance, and
   wherein the scheduling information allocates resources or services based on the predicted well dynamics behavior data.

5. The method of claim 1,
   wherein the well dynamics behavior includes well mass flow, well pressure, and well temperature performance of a well site of interest in the well system, and
   wherein the well system comprises interconnected subsystems that include a compressor subsystem and a sales header subsystem.

6. The method of claim 1,
   wherein the physics constrained machine learning model is trained based on at least six months of the well dynamics behavior data, and
   wherein the well dynamics behavior data include data for both normal operational conditions and shut-down conditions.

7. The method of claim 1,
   wherein the physics constrained machine learning model is obtained using a machine learning algorithm selected from a group consisting of is a Levenberg-Marquardt algorithm, a Gauss-Newton algorithm, a steepest descent algorithm, and an artificial neural network.

8. The method of claim 1:
   wherein the physics constrained machine learning model uses a misfit function which includes a well dynamics behavior prediction error, and
   wherein the well dynamics behavior prediction error is selected from a group consisting of integral square error (ISE), mean error (ME), normalized ISE, and normalized ME.

9. A well system, comprising:
   a well site;
   a physics-based modeling server that outputs modeled dynamics behavior data for the well site based on a physics-based model, wherein the physics-based model includes a valve module that corresponds to and emulates a control mechanism of the well system; and
   a digital twin manager, coupled to the physics-based modeling server and the well site, that includes a processor,
   wherein the digital twin manager:
     obtains, based on a predetermined monitoring criterion, well dynamics behavior data of the well site;
     obtains modeled well dynamics behavior data for the well system using a physics-based model;
     decomposes each of the well dynamics behavior data and the modeled well dynamics behavior data into a plurality of frequency band components based on a plurality of predetermined frequency partitions;

trains a physics constrained machine learning model using one or more machine learning algorithms based on the plurality of frequency band components of the decomposed well dynamics behavior data and the decomposed modeled well dynamics behavior data as input data;

obtains new well dynamics behavior data of the well site;

uses the physics constrained machine learning model and the physics-based model to generate and output predicted well dynamics behavior data based on the new well dynamics behavior data; and transmits a command to the well system that adjusts the control mechanism of the well system based on the predicted well dynamics behavior data, wherein the predicted well dynamics behavior data are predicted in frequency band components corresponding to the plurality of predetermined frequency partitions, wherein the plurality of predetermined frequency partitions increase in size from a smallest predetermined frequency partition to a largest predetermined frequency partition, wherein a frequency range of the smallest predetermined frequency partition is entirely included in each of the plurality of predetermined frequency partitions, and wherein the physics constrained machine learning model iteratively predicts the predicted frequency band components from the smallest predetermined frequency partition to the largest predetermined frequency partition that includes the frequency range of the smallest predetermined frequency partition.

10. The system of claim 9, wherein the physics-based model predicts components of the well dynamics behavior data that are below a predetermined frequency, wherein the physics constrained machine learning model is trained to predict components of the well dynamics behavior data that are above the predetermined frequency, and wherein the predicted frequency band components of the predicted well dynamics behavior data are merged by a straight or weighted summation.

11. The system of claim 10, wherein the predetermined frequency is determined by the physics-based model based on the predetermined monitoring criterion, and wherein the plurality of frequency band components of the decomposed well dynamics behavior data and the decomposed modeled well dynamics behavior data are obtained using a filter selected from a group consisting of a Butterworth filter, a Chebyshev filter, a Gaussian filter, a Bessel filter, an Elliptic filter, and a raised-cosine filter.

12. The system of claim 9, wherein the command to the well system includes manufacturing scheduling information to perform predictive maintenance, and wherein the scheduling information allocates resources or services based on the predicted well dynamics behavior data.

13. The system of claim 9, wherein the well dynamics behavior includes well mass flow, well pressure, and well temperature performance of a well site of interest in the well system, and wherein the well system comprises interconnected subsystems that include a compressor subsystem and a sales header subsystem.

14. A non-transitory computer readable medium storing instructions executable by a computer processor, the instructions comprising functionality for:

obtaining well dynamics behavior data of a well system based on a predetermined monitoring criterion;

obtaining modeled well dynamics behavior data for the well system using a physics-based model, wherein the physics-based model includes a valve module that corresponds to and emulates a control mechanism of the well system;

decomposing each of the well dynamics behavior data and the modeled well dynamics behavior data into a plurality of frequency band components based on a plurality of predetermined frequency partitions;

training a physics constrained machine learning model using one or more machine learning algorithms based on the plurality of frequency band components of the decomposed well dynamics behavior data and the decomposed modeled well dynamics behavior data as input data;

obtaining new well dynamics behavior data of the well system;

using the physics constrained machine learning model and the physics-based model to generate and output predicted well dynamics behavior data for the well system based on the new well dynamics behavior data; and transmitting a command to the well system that adjusts the control mechanism of the well system based on the predicted well dynamics behavior data, wherein the predicted well dynamics behavior data are predicted in frequency band components corresponding to the plurality of predetermined frequency partitions, wherein the plurality of predetermined frequency partitions increase in size from a smallest predetermined frequency partition to a largest predetermined frequency partition, wherein a frequency range of the smallest predetermined frequency partition is entirely included in each of the plurality of predetermined frequency partitions, and wherein the physics constrained machine learning model iteratively predicts the predicted frequency band components from the smallest predetermined frequency partition to the largest predetermined frequency partition that includes the frequency range of the smallest predetermined frequency partition.

15. The non-transitory computer readable medium of claim 14, wherein the physics-based model predicts components of the well dynamics behavior data that are below a predetermined frequency, wherein the physics constrained machine learning model is trained to predict components of the well dynamics behavior data that are above the predetermined frequency, and wherein the predicted frequency band components of the predicted well dynamics behavior data are merged by a straight or weighted summation.

* * * * *